United States Patent

Repay

[15] 3,648,526

[45] Mar. 14, 1972

[54] PUSHBUTTON SELECTOR STRUCTURE

[72] Inventor: Laszlo N. Repay, Rolling Meadows, Ill.

[73] Assignee: Motorola, Inc., Franklin Park, Ill.

[22] Filed: Oct. 5, 1970

[21] Appl. No.: 77,790

[52] U.S. Cl. .................................................74/10.27, 334/7

[51] Int. Cl. .........................................................F16h 35/18

[58] Field of Search ...............74/10.27, 10.29, 10.31, 10.33, 74/10.35, 10.37, 10.6, 10.7, 10; 334/7

[56] References Cited

UNITED STATES PATENTS 2,192,393 5/1940 Behringer .............................74/10.27

*Primary Examiner*—Milton Kaufman
*Attorney*—Vincent Rauner and L. Arnold

[57] ABSTRACT

A pushbutton selector structure for a radio receiver with a tuning carriage for the resonant circuits, the structure being suitable to provide a ganged assembly and including a pushbutton operated slide having a pair of parallel elongated actuator shafts mounted thereon which are adjustable along their respective lengths and have a pair of common end portions offsettable relative to each other by a presettable lengthwise distance whereby a desired station frequency is memorized. Flexible means for transmitting movement between the shafts and the tuning carriage are positioned in a guide channel and are movable by the shafts at least a distance equal to said offset lengthwise distance with the pushbutton operated slide depressed by an operator for recalling the memorized station frequency.

13 Claims, 8 Drawing Figures

INVENTOR
LASZLO N. REPAY
BY Lester N Arnold

ATTY.

Patented March 14, 1972

3,648,526

2 Sheets-Sheet 2

INVENTOR
LASZLO N. REPAY
BY Lester N. Arnold
ATTY.

PUSHBUTTON SELECTOR STRUCTURE

BACKGROUND

This invention relates to pushbutton selector structures for radio receivers, and more particularly to a presettable pushbutton structure for automatic tuning of a receiver.

One arrangement for automatically tuning a radio receiver is to provide a pushbutton operated slide which has a presettable cam means, a treadle bar operated with the movement of the slide by being conformed to the position of the cam means, and a movable tuning carriage linked to the treadle bar and effective to tune the resonant circuits of the receiver. Individual pushbutton structures are then ganged to provide a multi-pushbutton selector configuration for radio receivers having wide band reception in both the AM and FM modes. While radio receivers utilizing the treadle bar have been commercially successful, difficulties are encountered in reducing the size of the radio receiver due to the practical limit to which this type of pushbutton selector structure can be miniaturized.

SUMMARY

It is therefore an object of the present invention to provide an improved pushbutton selector structure having a pushbutton operated slide and presettable cam means of a structure adapted to be readily miniaturized.

It is another object to provide an improved means for transmitting the movement of the pushbutton operated slide to the tuning carriage to eliminate the known treadle bar.

It is still another object to provide a novel linear-movement transmitting means which includes amplification of the movement of the slide sufficient to move the tuning carriage over the entire range of available station frequencies of both the AM and FM modes.

In one embodiment of the invention, a pushbutton operated slide has a pair of parallel elongated shafts mounted thereon, which shafts are adjustable along their respective lengths and offsettable relative to each other by a predetermined and presettable lengthwise distance. End portions of the offset shafts are received within a guide channel as the slide is moved in one direction and are selectably engageable with a plurality of spherical balls positioned within the guide channel, and selectably engageable with a movable tab extending into the guide channel and connected to the tuning carriage of the receiver. With movement of the balls by a selected shaft, the tab is moved in a direction opposite of said one direction; and with movement of the tab by the other shaft, the tab is moved in said one direction, movement of the tab in either direction being at least equal to the presettable offset distance of the shafts whereby said tab is effective to move said tuning carriage to tune the resonant circuits of the receiver.

In another embodiment of the invention, the actuator shafts cooperate with the periphery of the guide channel to provide extension channels connected to the guide channel and providing continuations thereof. These extension channels have a difference in their lengths proportional to the presettable offset distance of the shafts and the difference is maintained as the shafts move into the guide channel in response to the depression of the slide in said one direction. A pair of flexible bands are secured within the extension channels and extend into the guide channel so as to be selectably engageable with opposite sides of the tab with depression of the slide. The lengths of the bands within the extension channels vary correspondingly with the variation in lengths of the extension channels accompanying the depression of the slide to cause the bands to move the tab in either said one direction or in said opposite direction to tune the resonant circuits of the receiver.

Other objects and advantages of the invention will occur to those skilled in the art as the invention is described in connection with the accompanying drawing in which:

THE DRAWING

DETAILED DESCRIPTION

Figure 1:
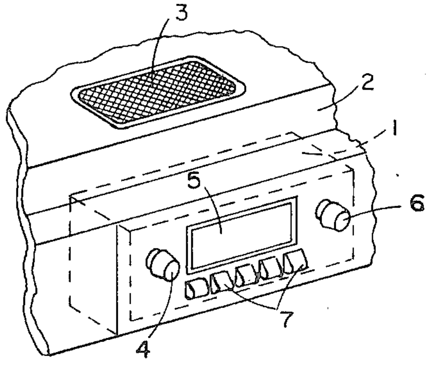
FIG. 1 is a perspective view of a type of radio receiver in which a pushbutton selector structure of the invention may be incorporated.

As shown in the accompanying drawing, a multi-pushbutton type automobile radio receiver 1 is shown mounted in the dashboard 2 of an automobile vehicle. A speaker opening 3 is provided in the top of the dashboard 2, and the radio incorporates a volume control knob 4, an indicator dial 5, a tuning knob 6, and a plurality of tuning pushbuttons 7. Radio receiver 1 may be tuned by means of either knob 6, which provides manual tuning through continuous rotary gear drive, or by depression of a selected one of the pushbuttons 7, each of which may be preset for a given tuner position whereby a desired station frequency is memorized and can be later recalled.

Figure 2:
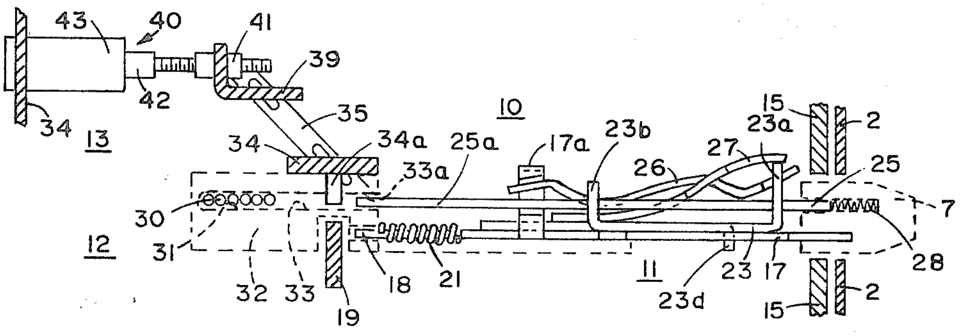
FIG. 2 is an elevational side view, partially in section, of the pushbutton selector structure connected to a tuning carriage of the radio receiver, and showing a pushbutton operated slide having a pair of actuator shafts engageable with a flexible transmitting means contained within a guide channel.
Figure 3:
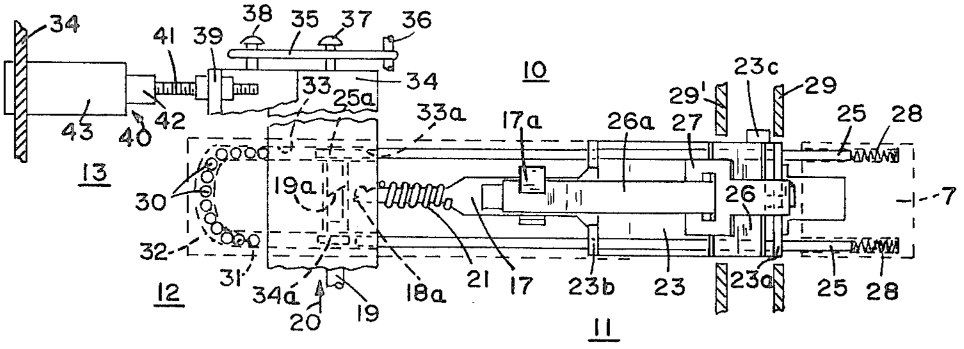
FIG. 3 is a top view of the structure of FIG. 2.
Figure 4:
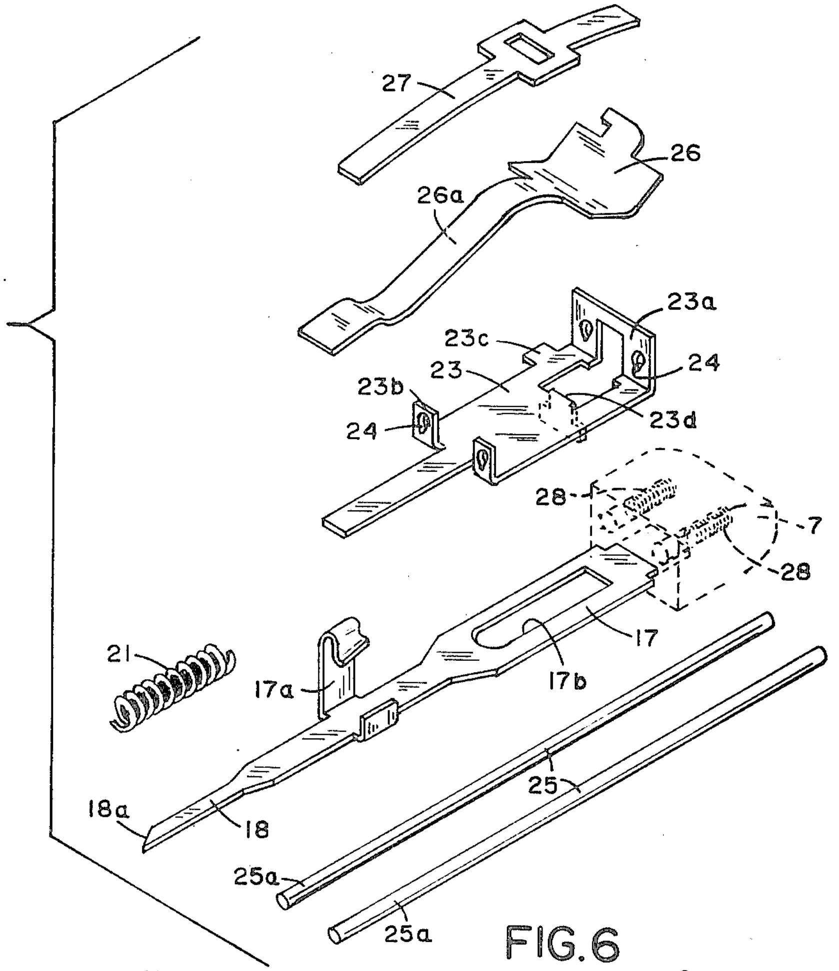
FIG. 4 is an exploded perspective view of the pushbutton operated slide of FIGS. 2 and 3.

FIGS. 2–4 show an individual pushbutton selector structure 10 for the radio receiver 1 including a pushbutton operated slide 11 and a flexible transmitting means 12, which transmitting means 12 is adapted to be connected through a mechanical linkage to a tuning apparatus 13 for tuning the receiver 1 to a preprogrammed station frequency by depressing the pushbutton 7 and the slide 11 in a well known manner. Generally, the structure 10 is readily adaptable for use in conjunction with substantially any radio receiver of the type commonly carried in the dashboards of automobiles and wherein the tuning apparatus employs a linear movement for tuning its resonant circuits, e.g., the axial movement of a ferromagnetic slug within an encompassing tuning coil. However, the pushbutton selector structure 10 is more conveniently illustrated in connection with a radio receiver having the manual tuning adjustments as set forth in U.S. Pat. No. 3,236,110, issued Feb. 22, 1966, and having a locking structure similar to that set forth in U.S. Pat. No. 3,277,729, issued Oct. 11, 1966, both of these referenced patents being assigned to the assignee of the present invention and to which the reader may refer for a more detailed description of those parts of the radio receiver.

As is well known for pushbutton structures generally, the structure 10 has three operable positions, to wit: a normal position permitting manual tuning of the receiver, a depressed position for automatically tuning the receiver, and an extended position for releasing the structure for memorizing a new station frequency as the structure is thereafter depressed. The structure 10 is shown in FIGS. 2 and 3 in its normal position in which the pushbutton 7 protrudes from an opening in the dashboard 2 and through an aligned opening in a face or front wall 15 of the radio receiver's chassis, only selected portions of the chassis being shown in FIGS. 2 and 3.

The pushbutton 7 typically may be used by an operator to automatically tune the receiver 1 by pulling the button 7 and the attached slide 11 to their fully extended position whereby the preprogrammed or memorized position of the structure 10 is erased, thereafter manually tuning a newly selected station frequency, then pushing the button 7 to its fully depressed position for reprogramming the structure 10 to memorize the new station frequency, and allowing the return bias of the structure 10 to return it to its normal position.

The slide 11 includes a slidable control plate 17 which is attached to the button 7 by an embedded end portion of the plate 17 to permit the control of the slide 11 by the button 7. On the opposite end of the control plate 17 from the button 7, the plate 17 includes a plunger rod 18 having a camming surface **18*a*. The plunger rod 18 is active to disengage the manual tuning gear mechanism (not shown) of the receiver 1 as the button 7 is depressed inwardly of the receiver's chassis. It is well understood that the disengagement of the manual tuning gear mechanism simultaneous with the pushbutton tuning operation is required to alleviate the frictional resistance of the torque transmitting gear train to the manual tuning knob 6**.

Briefly, the manual tuning gear mechanism is disengaged by the movement of a traverse cam bar 19 in the direction of the arrow 20, FIG. 3, which precipitates a mechanical declutching of the gear train. During the inward movement of the control plate 17 and plunger rod 18, the plunger rod acts as cam means whereby the camming surface 18a engages a camming surface **19*a*, FIG. 3, to cause the traverse movement of the cam bar 19. The control plate 17 and the button 7 are biased to return to the normal position of the structure 10 by a return spring 21**.

The slide 11 further includes a slidable frame member 23 mounted on the control plate 17; a pair of parallel elongated actuator shafts 25 mounted on the frame member 23; a locking lever 26 for providing a means of locking the shafts 25 in a particular fashion; and a clockwise (CW) biased leaf spring 27 for biasing the lever 26 out of engagement with the shafts 25.

The actuator shafts 25 are mounted in parallel on the frame member 23 by the support of the two receiving pairs of aligned apertures 24 provided respectively in forward and rearward upturned flanges **23*a* and 23*b*. The apertures 24 should loosely receive the shafts 25 so that the shafts can easily be moved therethrough, and any convenient shape of the apertures that will accomplish this purpose will suffice. The shafts 25 are to be separately slidable and adjustable along their lengthwise dimension so that they can be offset relative to each other by a predetermined and presettable lengthwise distance suitable for moving the tuning apparatus 13** to the position of the newly selected station frequency during automatic tuning.

One pair of common end portions of the shafts 25 are insertably received in suitable openings in the button 7 and are biased inwardly of the receiver 1 by the compression springs 28 for a purpose to be explained more fully hereinafter. The opposite pair of common end portions of the shafts 25, indicated at **25*a* in FIGS. 2–4, are active to engage the flexible transmitting means 12 with the depression of the button 7 during automatic tuning of the receiver 1. The common end portions 25*a* are thus offsettable relative to each other with lengthwise adjustment of the shafts 25, and thus comprise presettable cam means for the structure 10. The shafts 25 are carried by the slide 11 between the three positions of the structure 10** as stated above.

The actuator shafts 25 are lockable with respect to each other so as to maintain their respective lengthwise orientation by forcing the locking lever 26 against the shafts as shown in FIG. 2. The lever 26 is pivoted in a commonly known manner with the movement of the slide 11 between its three positions, e.g., the lever is pivoted counterclockwise (CCW) as viewed in FIG. 2 about a pivotable connection with the forward flange **23*a* of the frame member 23, and against a clockwise bias of the leaf spring 27 about the same pivot point, as the slide 11 is moved from its extended position to its normal position. For this purpose, the control plate 17 has a hook-shaped portion 17*a* for engaging a raised arcuate end portion of an elongated tongue 26*a* of the lever 26 to force the same to rotate counterclockwise sufficient to engage the shafts 25**.

In moving to the extended position of the slide 11, the control plate 17 will move relative to the frame member 23 by means of boss **23*c* on the frame member abutting an adjacent portion 29 of the receiver's chassis to prevent further movement of the frame member 23, and groove or slot 17*b* of the control plate 17 will permit movement of guide 23*d* within the slot 17*b*. This relative movement between the plate 17 and the member 23 forces the hook 17*a* from its locking engagement with the lever 26 to free the shafts 25** for lengthwise axial adjustment.

With movement of the slide to its normal position, the hook **17*a* rides on to the arcuate portion of the tongue 26*a* to force the lever 26 into engagement with the shafts 18, and the guide 23*d* moves to the forward edge of the slot 17*b*. Further depression of the slide 11 to its fully depressed position will move the button 7, control plate 17, frame member 23 and shafts 25 inwardly as a unit. The inward movement of the slide 11 may be limited for example by the boss 23*c* abutting against another portion 29′ of the receiver's chassis. This three-positional operation of the slide 11** is common to a variety of pushbutton structures for automobile radio receivers.

The transmitting means 12 of the structure 10 can be of any convenient form so long as it is flexible and generally incompressible thereby to be capable of transmitting linear movement between the slide 11 and the tuning apparatus 13. In the embodiment shown in FIGS. 2–4, the transmitting means 12 comprises a plurality of spherical balls 30 adjacently positioned within a tracklike passageway or guide channel 31 within an actuator housing 32.

The guide channel 31 is a continuous generally U-shaped channel with a pair of leg portions 33 having endwise openings **33*a*, respectively. It is to be understood that the particular shape of the channel is not considered critical to the present invention, the only requirements being that it contain a continuous path for movement of the transmitting means 12 and desirably contain at least a straight portion within which movement of the transmitting means 12 is linear. The endwise openings 33*a* are aligned to receive the common end portions 25*a* of the shafts 25 at least as the slide 11 is depressed beyond its normal position, and desirably to receive the same with the slide in its normal position whereby the balls 30 are prevented from rolling out of the channel 31 during non-level orientations of the structure 10**.

The spherical balls 30 are preferably loosely contained within the channel 31 and do not completely fill the channel except with the slide 11 in its depressed position. The movement of the slide 11 toward its depressed position causes the offset common end portions 25a to selectably engage the balls 30 so that the peripheries of adjacent balls engage to provide a generally incompressible chain of balls with which to transmit movement therethrough. Also, the diameter of the balls 30 are desirably slightly less than the diameter of the generally circular cross section of the channel 31 so as to prevent the chain of balls from buckling and jamming therein.

Additionally, the channel 31 contains a movable tab 34a of a slide bar 34, which slide bar 34 is mounted for linear movement on the actuator housing 32 and is connected to the tuning apparatus 13 through a tie bar 35. The tab **34*a* extends into the channel 31 within one of the leg portions 33 thereof so as to have linear movement along the channel, and is driven by the balls 30 with depression of the slide 11 during automatic tuning of the receiver 1. FIGS. 2 and 3 show the tab 34*a* positioned at one end of the chain of balls adjacent to and directly engageable with one of the common end portions 25*a*, but it is obvious that the tab 34*a* could as well be directly engageable on its opposite faces by the balls 30 so long as said tab remained oriented in one of the leg portions 33**.

The tie bar 35 provides a mechanical linkage to the tuning apparatus 13 suitable for transmitting and amplifying to the extent necessary the linear movement of the slide bar 34 thereto. It is apparent from the movement of the transmitting means 12 within the channel 31 that the slide bar 34 moves substantially the same distance as the offset lengthwise distance between the end portions 25*a* of the shafts 25. As this distance is not normally sufficient to tune the tuning carriage over its entire available range of station frequencies, the movement of the slide must be amplified. Where the movement of the transmitting means 12 incorporates a sufficient amplification of movement, the tab 34*a* can be connected directly to the tuning apparatus 13 and the tie bar 35 deleted. As best shown in FIG. 3, the tie bar 35 is provided a fixed pivot axis about pin 36, is connected to the slide bar by a pin 37 and to a portion of a slidable tuning carriage 39 of the tuning apparatus 13 by pin 38.

The tuning carriage 39 is connected by a screw rod and threaded anchor 41 to a standard type slug-tuned coil unit 40, comprising one of a plurality of tunable resonant circuits for the receiver 1 and having a movable slug 42 adjustably inserted within a tuning coil 43. Therefore, inward movement of the slide 11 during automatic tuning transfers the relative position of the shaft end portions 25*a* to the tuning carriage 39 via the balls 30, slide bar 34 and tie bar 35 for providing tuning of the associated coil unit 40.

In order to offset the common end portions 25*a* of the shafts 25 relative to each other, the slide 11 is pulled to its extended position thereby to free the shafts 25 from the locking lever 26. The compression springs 28 are then effective to force the shafts 25 inwardly of the guide channel 31 so that the end portions 25*a* engage the tab 34*a* and one end of the chain of balls 30. Next, the manual tuning of the receiver 1 by the knob 6 causes the tuning carriage to drive the slide bar 34 and hence, the tab 34*a* and the balls 30 within the channel 31. The shafts 25 conform to the new position of the balls 30 and the movable tab 34*a;* and by a proper choice of springs, the springs 28 are sufficiently soft so as not to resist or suppress the movement of the balls 30 during manual tuning.

In this manner, the shafts 25 are said to have memorized the particular manually tuned station frequency. Once the tuning is complete, the shafts 25 are locked in their newly offset position by depressing the pushbutton operated slide 11. In the normal position of the slide 11, the end portions 25*a* are spaced from the balls 30 and the tab 34*a* in order to permit the free movement of the tab 34a without the interference of the locked shafts 25.

An alternative embodiment of the invention is shown in FIGS. 5–8 wherein the same reference characters are used to designate similar parts. For purposes of illustrating the invention, only the portions of the embodiment shown in FIGS. 2–4 which have actually been modified are shown. It is to be understood that there is either no change to the previous structure or no change which would require explanation to those skilled in the pertinent art to which this invention pertains. Primarily, this alternative embodiment requires modification to the pair of actuator shafts 25 and the transmitting means 12.

Figure 5:
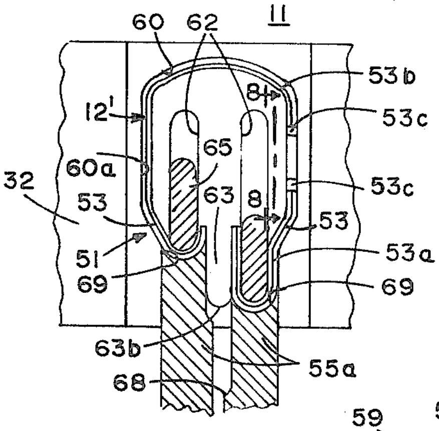
FIG. 5 is an elevational top view, partially in section, of an alternative embodiment of the actuator shafts, the flexible transmitting means and the guide channel for the structure of FIG. 2.

FIG. 5 shows a modified guide channel 51 conveniently provided within a generally central portion of an upper surface of the actuator housing 32 of the structure 10. The channel 51 is in lieu of the channel 31 and can be fitted with a suitable top cover (not shown) if so desired; the channel 51 is specially configured to utilize a modified transmitting means 12′ comprising a pair of relatively flat flexible bands 53 which are generally incompressible lengthwise and are engageable by common end portions 55*a* of a pair of modified actuator shafts 55. The actuator shafts 55 are generally bar-shaped and have top and bottom walls 56 and 57, respectively, and a pair of inner and outer side walls 58 and 59, respectively, designated according to the orientation of the shafts 55 with respect to each other when received in the guide channel 51 as shown in FIG. 5.

The shafts 55 are to be supported for lengthwise dimensional adjustment relative to each other on the frame member 23 in a similar fashion to the manner in which the shafts 25 are adjustably supported. The shafts 55 are biased inwardly of the receiver 1, are offsettable relative to each other by a predetermined and presettable lengthwise distance, are lockable with respect to each other, are slidably received within a portion of the modified channel 51, and cooperate with the channel 51 to move the flexible bands 53 in a particular fashion whereby the movement of the bands 53 is effective to tune the tuning apparatus 13 of the receiver 1.

Figure 6:
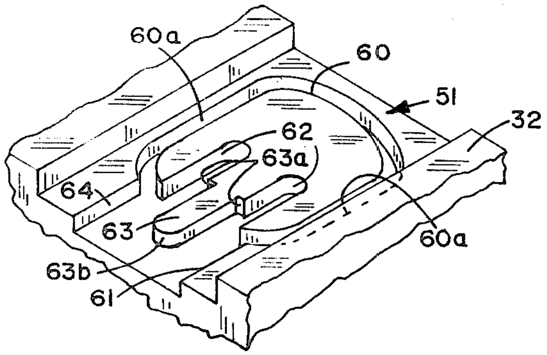
FIG. 6 is a perspective view of the guide channel of FIG. 5.

The guide channel 51, as shown in FIGS. 5 and 6, has a generally U-shaped outer groove 60 having a pair of leg portions 60*a*, a pair of endwise openings 61 a portion of which provides access to the leg portions, and a pair of parallel elongated inner grooves 62 positioned between the leg portions 60a and extending substantially parallel therewith. The pair of inner grooves 62 open into the pair of endwise openings 61 and provide a portion of actuator housing 32 therebetween that includes a forwardly protruding tongue portion 63, which tongue portion includes a pair of surfaces 63*a* on opposite sides of its base and a surface 63*b* on the tip of the tongue portion 63. The pair of endwise openings 61 extend between the sides of the tongue portion 63 and oppositely spaced shoulders 64 of the housing 32, respectively.

Figure 7:
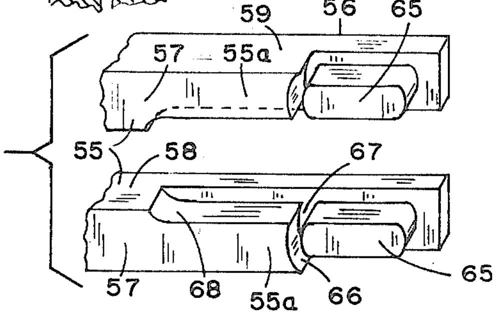
FIG. 7 is a perspective view of the alternative shafts of FIG. 5.

As shown in FIG. 7, the common end portions 55*a* of the shafts 55 are mirror-images of each other; and therefore, the particular detail of construction will only be given for one common end portion. The bottom wall 57 of the end portion 55*a* is recessed to provide a generally oblong boss 65 extending lengthwise thereof and being more narrow in width than the width of the shaft 55. The forwardmost end, the left end of the boss 65 as viewed in FIG. 7, has an adjacently spaced shoulder 66 to provide a pathway 67 therebetween. Forwardly of the shoulder 66, as viewed in FIGS. 5 and 7, the inner side wall 58 is recessed to provide a shoulder 68.

The particular manner in which the shafts 55 are received within channel 51 is clearly shown in FIG. 5, i.e., the oblong bosses 65 are slidably received within the pair of inner grooves 62, and the endwise openings 61 slidably receive the width of the shafts 55 that lies between the shoulders 66 and 67. The pathways 67 are further extended on each of the sides of the oblong bosses 65 between the tongue portion 63 on one side and the shoulder 64 on the opposite side due to the difference in width of the bosses 65 and the remainder portions of the shafts 55. These pathways provide extension pathways or channels 69 that connect to the leg portions 60*a* of the outer groove 60 to provide continuations of the outer groove 60.

It is readily obvious that the extension channels 69 are adapted to be varied in their lengths as the shafts 55 are moved within the guide channel 51, and are also of unequal lengths with any relative lengthwise offset position of the shafts 55, the difference in the lengths of the extension channels 69 being proportional to the presettable offset distance of the shafts and said difference being maintained as the shafts slide into the guide channel 51 in response to a depression of the slide 11 during automatic tuning of the receiver 1. The inward travel of the shafts 55 is limited as the shoulders 68 abut against the tip surface 63*b* of the tongue portion 63.

The pair of flexible bands 53 have first end portions 53*a* that are positioned within the pair of extension channels 69 and second end portions 53*b* that extend into the outer groove 60 of the guide channel 51. The first end portions 53*a* are secured to the base surfaces 63*a*, respectively; and therefore, the second end portions 53*b* are free to move with respect to each other in the outer groove 60. The bands 53 are provided with an unequal length in order to position the same in a selected one of the leg portions 60*a* for providing linear movement thereof.

Figure 8:
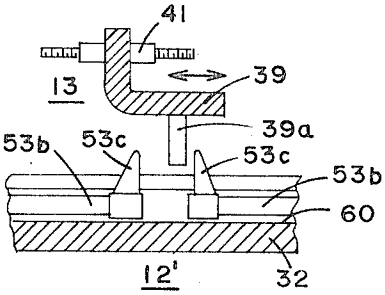
FIG. 8 is an elevational side view, partially in section, of the apparatus of FIG. 5 as taken along the line 8—8, then connected to the tuning carriage of FIG. 2.

The operation of the alternative embodiment is the same as for the primary embodiment shown in FIGS. 2–4 except that the bands 53 move within the channels 69 on both sides of the shafts 55, resulting in an amplification of the movement of the second end portions 53*b* of the bands 53 of double the movement of the shafts. This amplification of movement may be adequate to tune the associated resonant circuits of the receiver 1 without the use of the transmitting and amplifying mechanical linkage provided by the tie bar 35. If so, the movable tuning carriage 39 can be provided with a tab 39*a* similar to the tab 34*a* of the slide bar 34 for direct bidirectional movement of the tuning carriage 39 by the second end portions 53*b* of the bands 53 as shown in FIG. 8. For this purpose, the second end portions 53b can be provided with suitable protrusions 53*c*, respectively, to ensure proper engagement with the tab 39*a*, as well as to eliminate the necessity for extending the tab 39*a* into the outer groove 60.

With the slide 11 in its extended position thereby permitting the shafts 55 to be unlocked, the common end portions 55*a* of the shafts 55 are offsettable by the tab 39*a* during manual tuning of the receiver 1. In the normal position of the slide 11, the second end portions 53*b* are spaced apart enough to permit the tab 39*a* to move therebetween without engaging them. During automatic tuning of the receiver 1 by depression of the slide 11 and the shafts 55, the closest second end portion 53*b* engages the movable tab 39*a* and is effective to move the tuning carriage to the proper position for tuning the receiver to the desired preprogrammed station frequency.

It is to be understood that while the present invention has been shown and described with reference to the preferred embodiments thereof, the invention is not limited to the precise forms set forth, and that various modifications and changes may be made therein without departing from the spirit and scope of the present invention.

I claim:

1. In combination, a radio receiver and a pushbutton selector structure for automatic tuning of said radio receiver having a movable tuning carriage for tuning the resonant circuits of the receiver, said structure comprising in combination: a guide channel, a movable tab connected to said tuning carriage, flexible transmitting means positioned in said guide channel and engageable with said tab to move said tab in one direction, a pushbutton operated slide having presettable cam means engageable with said transmitting means, said slide and said cam means movable in a direction opposite to said one direction for driving said transmitting means into engagement with said tab whereby said tab is effective to move said tuning carriage to tune the resonant circuits of said receiver.

2. The combination as claimed in claim 1 wherein said cam means is selectably engageable with said transmitting means to move said tab in said one direction, and is selectably engageable with said tab to move the same in said opposite direction.

3. The combination as claimed in claim 2 wherein said presettable cam means comprises a pair of parallel elongated shafts which are slidably adjustable along their lengths and include a pair of common end portions offsettable relative to each other by a predetermined lengthwise distance, said slide includes means for locking said common end portions to retain their relative offset lengthwise distance and said guide channel includes a pair of endwise openings aligned with said pair of common end portions to receive the same therethrough with movement of said slide in said opposite direction, and one of said common end portions is selectably engageable with said transmitting means and the other of said common end portions is selectably engageable with said tab, the movement of the selected one of said transmitting means and said tab at least equal to the offset lengthwise distance of said shafts.

4. The combination as claimed in claim 3 wherein said transmitting means comprises a plurality of spherical balls adjacently positioned within said guide channels so that the peripheries of said adjacent balls are engageable to provide a generally incompressible chain of balls, and said guide channel includes a straight section along which said chain of balls is engageable with said tab to impart linear movement to said tab thereby to impart a linear movement to said tuning carriage.

5. The combination as claimed in claim 3 wherein said radio receiver includes adjustable manual tuning means adapted to be connected to said tuning carriage to selectably move said tuning carriage for manual tuning of said receiver, said slide is also movable in said one direction and said means for locking said shafts is releasable with movement of said slide in said one direction, means for biasing said shafts in said opposite direction engage said shafts to move the same into engagement with said tab and said transmitting means, respectively, with said release of said shafts by said locking means, said tab is selectably moved in said opposite and said one direction with the selectable movement of said tuning carriage by said manual tuning means, said tab is engageable with said transmitting means with movement of said tab in said opposite direction to move said one common end portion of said shafts in said one direction through said transmitting means and to allow movement of said other common end portion in said opposite direction by said biasing means, and further said tab is engageable with said other common end portion with movement of said tab in said one direction to move the same in said one direction and to allow movement of said transmitting means in said one direction and movement of said one common end portion in said opposite direction by said biasing means.

6. The combination as claimed in claim 5 wherein said slide includes another cam means for disconnecting said manual tuning means from said tuning carriage with movement of said slide in said opposite direction whereby the tuning carriage is free to move relative to said manual tuning means with automatic tuning of said receiver.

7. The combination as claimed in claim 1 wherein said transmitting means that is engageable with said tab is a first transmitting means, a second transmitting means is positioned in said guide channel and is engageable with said tab to move said tab in said opposite direction, and said cam means is engageable with said first and second transmitting means for selectably driving the same into engagement with said tab.

8. The combination as claimed in claim 7 wherein said guide channel includes a pair of endwise openings, said presettable cam means includes a pair of parallel elongated shafts adjustably mounted on said slide and portions of which are adapted to be slidably received within said pair of endwise openings with movement of said shafts in said opposite direction, the portions of said shafts cooperate respectively with said endwise openings to provide a pair of extension channels connected to said guide channel and providing continuations thereof, said extension channels have lengths adapted to be varied with movement of said shafts in said opposite direction, and portions of said first and second transmitting means are positioned in said extension channels, respectively, so that the lengths of said portions are adapted to be varied correspondingly with the lengths of said extension channels.

9. The combination as claimed in claim 8 wherein said shafts are adjustable along their lengths with respect to each other and are offsettable relative to each other by a predetermined lengthwise distance, and said extension channels have a difference in their lengths proportional to said predetermined offset lengthwise distance of said shafts and said difference is maintained as said shafts are moved in said opposite direction to selectably move said tab through said first and second transmitting means a distance at least equal to said offset lengthwise distance of said shafts.

10. The combination as claimed in claim 9 wherein the lengths of said extension channels vary at least twice the amount of the movement of said shafts in said opposite direction to provide an amplification of the movement of said shafts sufficient for moving said tab and said tuning carriage over an entire range of available station frequencies.

11. The combination as claimed in claim 8 wherein said first and second transmitting means comprise a pair of generally incompressible metal bands.

12. In combination, a radio receiver and a pushbutton selector structure for automatic tuning of said radio receiver having a movable tuning carriage for tuning the resonant circuits of the receiver, said structure comprising in combination: an actuator housing including a guide channel having a pair of endwise openings, a tab connected to the movable tuning carriage to move said tuning carriage for tuning said resonant circuits over an available range of station frequencies for the receiver, a plurality of spherical balls adjacently positioned in said guide channel and engageable with each other and with said tab to move said tab in one direction, a pushbutton operated slide movable in a direction opposite to said one direction and including a pair of parallel elongated shafts mounted thereon, said shafts adjustable along their lengths with respect to each other and offsettable relative to each other by a predetermined lengthwise distance, said pair of shafts being slidably received in said pair of endwise openings with movement of said slide in said opposite direction, and one of said shafts selectably engageable with said balls to move said tab in said one direction and the other of said shafts selectably engageable with said tab to move the same in said opposite direction, the selective movement of said tab being at least equal to the offset lengthwise distance of said shafts.

13. In combination, a radio receiver and a pushbutton selector structure for automatic tuning of said radio receiver having a movable tuning carriage for tuning the resonant circuits of the receiver, said structure including in combination: an actuator housing including a guide channel having a pair of endwise openings, a tab connected to the movable tuning carriage to move said tuning carriage for tuning said resonant circuits over an available range of station frequencies for the receiver, a pushbutton operated slide movable in a first direction and including a pair of parallel elongated shafts mounted thereon, said shafts being slidably received in said pair of endwise openings with movement of said slide in said first direction and cooperating with said pair of endwise openings to provide a pair of extension channels connected with said pair of endwise openings, said extension channels providing continuations of said guide channel and having lengths adapted to be varied with movement of said shafts in said first direction, and a pair of generally incompressible bands having first end portions secured within said pair of extension channels and having lengths adapted to be correspondingly varied therewith, and said bands having second end portions extending into said guide channel through said pair of endwise openings and engageable with said tab to selectably drive said tab in said first direction and in a second direction opposite of said first direction with movement of said shafts in said first direction and with the corresponding variation in lengths of said extension channels and said first end portions of said bands.

* * * * *